United States Patent [19]

Piret et al.

[11] Patent Number: 5,905,739
[45] Date of Patent: May 18, 1999

[54] METHOD AND DEVICE FOR DETECTING AND CORRECTING ANY ERROR IN A SEQUENCE OF NUMBERS

[75] Inventors: Philippe Piret, Cesson-Sevigne; Pascal Coudray, La Chapelle des Fougeretz, both of France

[73] Assignee: Canon Kabushiki Kaisha, Tokyo, Japan

[21] Appl. No.: 08/742,582

[22] Filed: Oct. 28, 1996

[51] Int. Cl.[6] .................................................. H03M 13/00
[52] U.S. Cl. ........................................................ 371/37.01
[58] Field of Search .............................. 371/37.01, 37.04, 371/42

[56] References Cited

U.S. PATENT DOCUMENTS

| | | | |
|---|---|---|---|
| 4,013,997 | 3/1977 | Treadwell, III | 340/146.1 |
| 4,586,183 | 4/1986 | Wilkinson | 371/39 |
| 4,794,239 | 12/1988 | Allais | 235/462 |
| 5,373,513 | 12/1994 | Howe et al. | 371/42 |
| 5,479,515 | 12/1995 | Longacre et al. | 380/54 |
| 5,619,027 | 4/1997 | Ackley | 235/462 |

FOREIGN PATENT DOCUMENTS 405099   1/1991   European Pat. Off. .
667592   1/1995   European Pat. Off. .

Primary Examiner—Stephen M. Baker
Attorney, Agent, or Firm—Fitzpatrick, Cella, Harper & Scinto

[57] ABSTRACT

According to a first aspect, the invention relates to the transmission of an "initial" sequence of at most $2^n$ numbers, where n is a predetermined natural number, representing binary data modulating a predetermined physical quantity, characterized in that, successively:

an "encoding" phase consists of adding to the initial sequence two "coherence" numbers to form a "total transmitted" sequence whose binary data are the subject of the said modulation, the two coherence numbers being determined so that two predetermined "coherence check" combinations applied to a total transmitted sequence each give a predetermined modulo P value, where P is a number more than $2^n$, a "decoding" phase consists of applying the said combinations to the numbers of the total received sequence and, where the results of the said combinations are not equal to the said predetermined modulo P values, deducing therefrom that a transmission error has occurred.

26 Claims, 13 Drawing Sheets

METHOD AND DEVICE FOR DETECTING AND CORRECTING ANY ERROR IN A SEQUENCE OF NUMBERS

The present invention relates to a method and device for detecting and correcting any error in a series of binary words modulating a physical quantity.

The present invention relates in particular to the detection of any bar code reading errors, and more generally to errors in data transmission between two systems.

Any transfer of data between two devices may include transmission errors. These errors, as well as their number, depend on the transmission medium, that is to say on the channel allowing a data item to pass from one system to another. This medium can be conventional, used in telecommunications or in data storage, on an optical, magnetic, electrical etc medium.

The invention relates both to the remote transfer of data and to the transfer of data between two components of the same circuit or two elements of the same system between which a transfer of the said data occurs.

Many bar codes provide the option of adding to the stored data a check digit serving to check whether or not the Data received includes errors. Generally, a numerical value is assigned to each character. The alphanumeric code 39, for example, effects the sum, modulo 43, of the value assigned to the message characters and adds the character whose assigned value is equal to this sum. When all of the characters have been received, the sum, modulo 43, of all of the characters except for the last one must be equal to the last character. If not, it is known that a transmission error has occurred. On the other hand, this code does not allow the correction of transmission errors.

Another alphanumeric bar code, called code 93, includes, just before the end of read delimiter (the last data of the code), two check keys for the detection and correction of an erroneous alphanumeric character. The detection principle is based on a modulo 47 counting. However, only an alphabet containing fewer than 48 characters can be processed by this method, and the use of the number 47 as a basis of calculation complicates the decoding algorithm which determines whether or not there has been a transmission error, and especially where the error is located and how to correct it.

Code 128, associated with its check key, offers the option of using an alphabet with 128 characters. This code also has a check character placed just before the end of read character. It is calculated in the following manner: the value of each significant character (with the exception of the start of code character) is multiplied by the value of the position of this character in the character sequence, the first position furthest to the left having 1 as a value, the next one, 2, the next one, 3, and so on. The sum of these products is added to the value of the start of code character and the total thereby obtained is divided by 103, the whole remainder corresponding to the value of the check character to be encoded. Reading errors cannot therefore be corrected, but only detected.

Finally, none of these codes is capable of correcting an error consisting of the addition or subtraction of a binary symbol in any of the characters of the sequence or of a bar in any bar code position.

The present invention aims to remedy these drawbacks. First of all, an error detection and correction method was sought for a device having an alphabet with a maximum of 67 characters, for example a binary septuplet alphabet not including more than four consecutive identical binary symbols, whose first three symbols are not identical and whose last three symbols are not identical (the alphabet found in the first and fifth columns of the accompanying Table I).

The inventor in addition sought to develop a method for calculating redundancies (coherence numbers) which can be carried out simply, and a method for utilising these coherence numbers which is also simple to implement in a very fast device.

The inventor also sought to develop a method and associated devices allowing him to detect with certainty bar code reading errors, produced according to the method described in Patent Application 95 400 178.

Finally, the inventor sought to produce a method and a device, both of which allow the detection and correction not only of an error in the transmission of a number, but also the addition or subtraction of a binary symbol in a random position of any number in a sequence of at most $2^n$ numbers, where n is a predetermined natural number.

The object of the invention is therefore a method for detecting and correcting any transmission error in an "initial" sequence of at most P-3 numbers, where P is a predetermined natural number, representing binary data, and modulating a predetermined physical quantity, characterised in that, successively:

an "encoding" phase consists of adding to the initial sequence two "coherence" numbers to form a "total transmitted" sequence, the two coherence numbers being determined so that two predetermined "coherence check" combinations applied to the total transmitted sequence each give a predetermined modulo P value, at least a first one of the said combinations combining the numbers in the total transmitted sequence variably as a function of the position of each number in the total transmitted sequence, a "transfer" phase consists of the physical quantity being modulated by the total transmitted sequence, transferred and demodulated to form a total "received" sequence, a "decoding" phase consists of applying the said combinations to the numbers in the total received sequence, and, where the results of the said combinations are not equal to the said predetermined modulo P values, deducing therefrom that a transmission error has occurred and correcting it.

By virtue of these measures, the encoding method according to the invention overcomes the drawbacks mentioned above. This method for generating redundancies (or coherence numbers) is simple and enables a correction device according to the invention to detect transmission errors and to correct them.

Another advantage of the present invention is that it is not necessary to know in advance the number of data transferred in order to implement the method.

The method according to the invention can be used whenever the number of different usable characters consists of at most P elements, as for example the set of sextuplets, six-bit groups constituting an alphabet of $2^6=64$ different characters, it being understood that the redundancies (coherence numbers) can assume P, which is then more than $2^6$, different values and must thus each be represented by at least seven bits, in this example.

According to a particular embodiment, P is a prime number. An advantage of this particular embodiment is that the "initial" sequence can effectively have P-3 numbers. If P is not a prime number, the number of numbers in the "initial" sequence is limited to less than P-3 numbers.

According to a particular embodiment, P has a primitive number. An advantage of this particular embodiment is that each position in the "initial" sequence can be coded as a power of said primitive number, modulo P.

According to a particular embodiment, 2 is a primitive number of P. Each position in the "initial" sequence can be coded as a power of 2, modulo P.

According to a particular embodiment, the second combination combines the numbers in the total transmitted sequence independently of their position in the total transmitted sequence, by adding them together. According to this same particular embodiment, the first combination is equal to the sum, modulo P, of the products of each of the numbers in the total transmitted sequence and a non-zero integer less than P, called the "position number", the said position number being attributed only to the said position of the said number in the total transmitted sequence. The "decoding" phase consists of adding, modulo P, all the numbers in the total received sequence, the difference between the said sum and the predetermined value corresponding to the second combination being equal to any error, and, if this error is not nil, dividing by the said error, modulo P, the difference between the sum of the products of each of the numbers in the total received sequence and its position number and the sum of the products of the numbers in the total transmitted sequence and the same position numbers, and thereby obtaining the position number attributed to the position of the error in the total received sequence.

One advantage of this particular embodiment is that it makes it possible to detect any error in the transmission of these numbers, to pinpoint its position, and to correct it.

Even more particularly, the second of the combinations is the sum, modulo P, of the numbers of the total transmitted sequence, and the corresponding predetermined value is nil.

This first aspect of the invention has the advantage that its calculation method is iterative and that, as a consequence, a simple electronic circuit can perform it.

As an example, P=67 and the method uses a modulo 67 counting method which has as a first advantage the fact that it corresponds exactly to the number of symbols in Patent Application 95400178. It has the advantage of being a prime number, and thus that modulo 67 division is clearly defined. It also has the advantage that P has at least a primitive number, 2, that is to say that the sequence of the numbers obtained by calculating the remainder of the division of the successive powers of 2 by 67 is the sequence of the numbers from 1 to 66 but in a different order. The successive powers of 2, modulo 67, can thus constitute position numbers which are easy to calculate.

This calculation of coherence numbers enables a correction device according to the invention to determine any error in the transmission of the initial sequence of numbers and to correct the said error. This is because the sum, modulo P, of the numbers of the total received sequence, including the two coherence numbers, is equal to any error affecting the total received sequence, that is to say the difference between an erroneous number in the total received sequence and the corresponding number in the total transmitted sequence.

By effecting on the total received sequence the same second combination as that effected on the total transmitted sequence, and by dividing this combination by the sum, modulo P, of the numbers in the total received sequence, the integer attributed to the position of the said erroneous number in the total received sequence is obtained.

Thus, according to the first aspect of the invention, after a "transfer" phase in the course of which the total transmitted sequence has been modulated, transferred and demodulated into a total received sequence, a "decoding" phase consists of adding all the numbers in the total received sequence, the said sum being equal to any transmission error, and consists, if this error is not nil, of dividing the sum of the products of each of the numbers in the total received sequence by the integer attributed to the said position of the said number in the total received sequence, division by the said error, and of obtaining, modulo P, the integer attributed to the position of the error in the total received sequence.

This first aspect of the invention relates to an error in the transmission of the numbers which does not affect the number of binary data representing them.

On the contrary, the second aspect of the invention relates to the accidental appearance or disappearance of a binary symbol, and enables it to be detected and corrected.

In general terms, the second aspect of the present invention relates to a method for detecting and correcting any error in the transmission of a "total transmitted" sequence of numbers each represented by a number N of binary symbols modulating a predetermined physical quantity, the said total transmitted sequence including at least two "coherence" numbers adapted, according to a "location and evaluation" process, to permit the rectification of any error, characterised in that in a "counting" phase, it consists of counting the number of binary symbols in the total received sequence originating from the demodulation of the physical quantity representing the total transmitted sequence, and, where this number is equal to a multiple of N, minus an integer j less than half of N, in a "replacement" phase, of replacing, in the total received sequence and successively, groups of N−j consecutive binary symbols with groups of N "replacement" binary symbols, and, in a "validation" phase, of determining whether the position of this replacement is correct by implementing the location and evaluation process.

Still in general terms, according to its second aspect, the invention relates to a method for detecting and correcting any error in the transmission of a "total transmitted" sequence of numbers each represented by a number N of binary symbols modulating a predetermined physical quantity, the said total transmitted sequence including at least two "coherence" numbers adapted, according to a "location and evaluation" process, to allow the rectification of any error, characterised in that in a "counting" phase, it consists of counting the number of binary symbols in the total received sequence originating from the demodulation of the physical quantity representing the total transmitted sequence, and, where this number is equal to a multiple of N, plus an integer j less than half of N, in a "replacement" phase, of replacing in the total received sequence and successively, groups of N+j consecutive binary symbols with groups of N "replacement" binary symbols, and, in a "validation" phase, of determining whether the position of this replacement is correct by implementing the location and evaluation process.

In particular, the error location and evaluation process can be constituted by the method according to the first aspect of the invention, which is referred to above as the error detection and correction method.

More particularly, according to the second aspect of the invention, the object of the invention is a also a method for detecting and correcting any error in the transmission of a "total transmitted" sequence of fewer than P numbers, each represented by N+1 binary symbols modulating a predetermined physical quantity, the said total transmitted sequence including at least two "coherence" numbers according to the first aspect of the invention, characterised in that in a "counting" phase, it consists of counting the number of binary symbols in the total received sequence originating from the demodulation of the physical quantity representing the total transmitted sequence, and, where this number is equal to a multiple of N+1, minus an integer j less than (N+1)/2, in a "replacement" phase, of replacing, in the total received sequence and successively, groups of N+1−j consecutive binary symbols with groups of N+1 "replacement" binary symbols, and, in a "validation" phase, of determining whether the position of this replacement is correct by implementing the method according to the first aspect of the invention.

Still according to this second aspect of the invention in particular, the method for detecting and correcting any error in the transmission of a "total transmitted" sequence of fewer than P numbers each represented by N+1 binary symbols modulating a predetermined physical quantity, the said total transmitted sequence including at least two "coherence" numbers according to the first aspect of the invention, characterised in that in a "counting" phase, it consists of counting the number of binary symbols in the total received sequence originating from the demodulation of the physical quantity representing the total transmitted sequence, and, where this number is equal to a multiple of N+1, plus an integer j less than (N+1)/2, in a "replacement" phase, of replacing, in the total received sequence and successively, groups of N+1+j consecutive binary symbols with groups of NT+1 "replacement" binary symbols, and, in a "validation" phase, of determining whether the position of this replacement is correct by implementing the method according to the first aspect of the invention.

It should be noted that, among the risks of errors, those involving only one binary data item are the most probable, and that the present invention is therefore highly effective.

In addition, the object of the invention is a device for coding an "initial" sequence of at most P-3 numbers, where P is a predetermined natural number, including a central processing unit adapted for adding, to the initial sequence, two "coherence" numbers in order to form a "total transmitted" sequence, the two coherence numbers being determined so that the result of each of two predetermined "coherence check" combinations applied to the total transmitted sequence, gives a predetermined modulo P value, at least a first one of the said combinations combining the numbers in the total transmitted sequence variably as a function of the position of each number in the total transmitted sequence and in that it includes a modulator of a physical quantity adapted for transmitting the total transmitted sequence whilst modulating a physical quantity.

Another object of the invention is a device for detecting and correcting an error in the transfer of a total transmitted sequence by a device described in the preceding paragraph, characterised in that it includes a demodulator of the said physical quantity supplying a total "received" sequence representing the total transmitted sequence, and a central processing unit adapted to apply the said combinations to the numbers of the total received sequence, and, where the results of the said combinations are not equal to the said predetermined modulo P values, deducing therefrom that a transmission error has occurred.

A further object of the invention is a device for detecting and correcting an error in the transfer of a total transmitted sequence of numbers each represented by N binary symbols; characterised in that it includes a demodulator of the said physical quantity supplying a total "received" sequence representing the total transmitted sequence, and a central processing unit adapted to count the number of binary symbols in the total received sequence and, where this number is equal to a multiple of N minus an integer j less than half of N, in a "replacement" phase, of replacing, in the total received sequence and successively, groups of N−j consecutive binary symbols with groups of N "replacement" binary symbols.

Another object of the invention is a device for detecting and correcting an error in the transfer of a total transmitted sequence of numbers, each represented by N binary symbols; characterised in that it includes a demodulator of the said physical quantity supplying a total "received" sequence representing the total transmitted sequence, and a central processing unit adapted to count the number of binary symbols in the total received sequence and, where this number is equal to a multiple of N, minus an integer j less than half of N, in a "replacement" phase, of replacing, in the total received sequence and successively, groups of N−j consecutive binary symbols with groups of N "replacement" binary symbols.

A further object of the invention is a device for detecting and correcting an error in the transfer of a total transmitted sequence of numbers, each represented by N binary symbols, characterised in that it includes a demodulator of the said physical quantity supplying a total "received" sequence representing the total transmitted sequence, and a central processing unit adapted to count the number of binary symbols in the total received sequence and, where this number is equal to a multiple of N, plus an integer j less than half of N, in a "replacement" phase, of replacing, in the total received sequence and successively, groups of N+j consecutive binary symbols with groups of N "replacement" binary symbols.

More particularly, the detection and correction device according to the invention is characterised in that the central processing unit is adapted to:

effect a second combination equal to the sum of the numbers in the total received sequence, subtract from this second combination the predetermined value equal to the sum of the numbers in the total transmitted sequence, any error to be corrected being equal to this difference, and, if the error is not nil, to effect a first combination equal to the sum of the products of the numbers in the total transmitted sequence and the "position" numbers related to the positions of these numbers in the total sequence, to divide the difference between the result of the first combination applied to the total received sequence and the first combination applied to the total transmitted sequence, by any error, the result of this division giving the position number attributed to the position at which the erroneous number is found, and in that the replacement number is validated during the validation phase when the position number at which the erroneous number is found is that of the replacement number, or when the error is nil.

Finally, the object of the invention is a bar code printer, a bar code reader, a network transceiver and a remote transceiver incorporating a device according to the present invention.

Other aims, characteristics and advantages of the invention will emerge from a reading of the description which follows, made with reference to the drawings attached for purposes of explanation and which are in no way limiting, in which.

Figure 1:
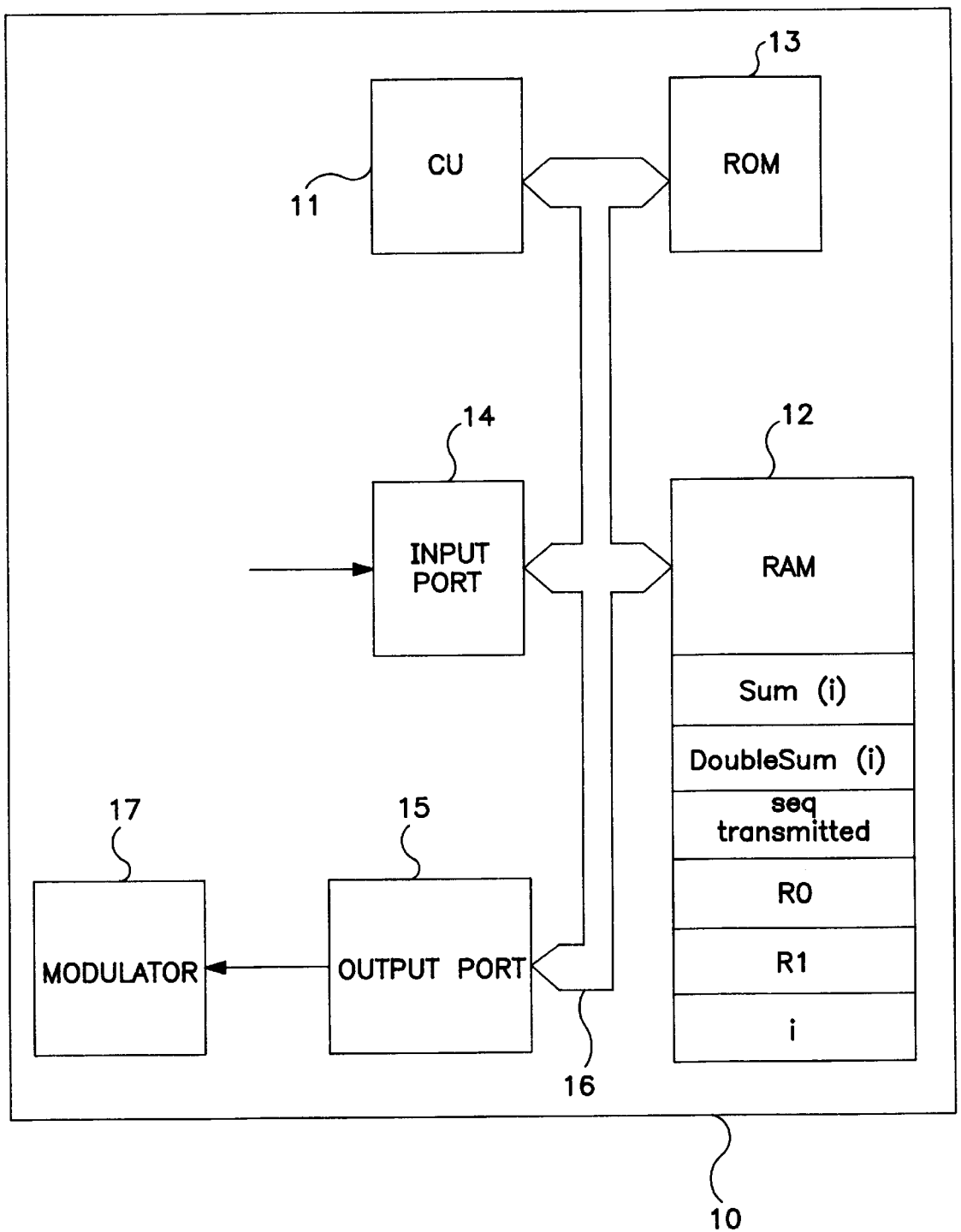
FIG. 1 is a block diagram of a device for generating coherence numbers according to the invention.

To illustrate an example of how the coherence numbers are generated, several tables are presented appended to the description, and form an integral part thereof:

Table 1 shows, in columns 3 and 7, examples of symbols (here mainly alphanumeric characters), in columns 2 and 6, an example of a number between 0 and 66 which is associated with each of its symbols, and, in columns 1 and 5, the binary word associated with it in the particular case of bar code printing as described in the aforementioned patent;

Table 2 contains, in columns 2 and 4, the modulo 67 values of the successive powers of 2, up to 2 to the power of 66, a power expressed in columns 1 and 3. These values are intended to constitute "position numbers".

Table 3 contains, in columns 2 and 4, the base 2 logarithm values of numbers 1 to 66, in columns 1 and 3, when the calculations are effected modulo 67. For example, the base 2 logarithm of 17 is 64, because the remainder, modulo 67, of 2 raised to the power of 64 is 17. Table 3 describes the correspondence function which is the inverse of that described in Table 2.

Table 4 contains, in columns 2 and 4, the modulo 67 inverse values of the numbers in columns 1 and 3. Multiplication by the inverse number of a given number corresponds, modulo 67, to division by the said given number.

According to known definitions in the coding field, the following terms are used throughout the remainder of the description:

binary symbol: symbol which can assume two values, generally zero and one;

binary word: a sequence of binary symbols of predetermined length;

character: a sequence of binary symbols of predetermined length forming part of an alphabet;

number: number associated with each of the binary words initial sequence: sequence of binary words representing the data to be transferred;

total transmitted sequence: initial sequence to which two binary words associated with coherence numbers have been added;

total received sequence: result of the demodulation of the physical quantity which has served as a medium for the modulation and transfer of the total transmitted sequence;

coherence number: number resulting from a combination of the numbers associated with the binary words of the total transmitted sequence; and replacement number: any binary word replacing a set of consecutive binary symbols in a "replacement phase".

These tables are stored in the ROMs described below. In this way a simple reading of the ROM avoids the need to recalculate each of these values in order to use the invention.

A description will now be given, with reference to FIG. 1, of an embodiment of the device according to its first aspect. This device is illustrated in the form of a block diagram and represented by the general reference number 10. It includes, connected to one another by an address and data bus 16:

a central processing unit 11;

a RAM 12;

a ROM 13;

an input port 14 serving to receive the data to be transferred to which the device must add the coherence numbers;

an output port 15 enabling the device to transfer a total transmitted sequence, including numbers representing these same data to be transferred and coherence numbers;

a modulator 17 of a physical quantity by means of an electrical signal.

The RAM 12 has in particular a register in which is stored the "initial sequence" made up of at most 64 numbers which can assume 67 different values and which may represent characters or symbols. These numbers are made up of seven binary symbols, none of which include more than four consecutive binary symbols with the same logic state, the first three of which are not in the same logic state and the last three of which are not in the same logic state. The RAM 12 in addition has seven registers storing seven groups of variables described below, i, n(i), Sum(i), DoubleSum(i), seq transmitted, R0 and R1. The ROM 13 is adapted to store the operating program of the central processing unit 11. The central processing unit 11 is adapted to use the flow diagram described in FIG. 3.

This configuration is known to IT systems experts, and is therefore not described in greater detail here.

Figure 6:
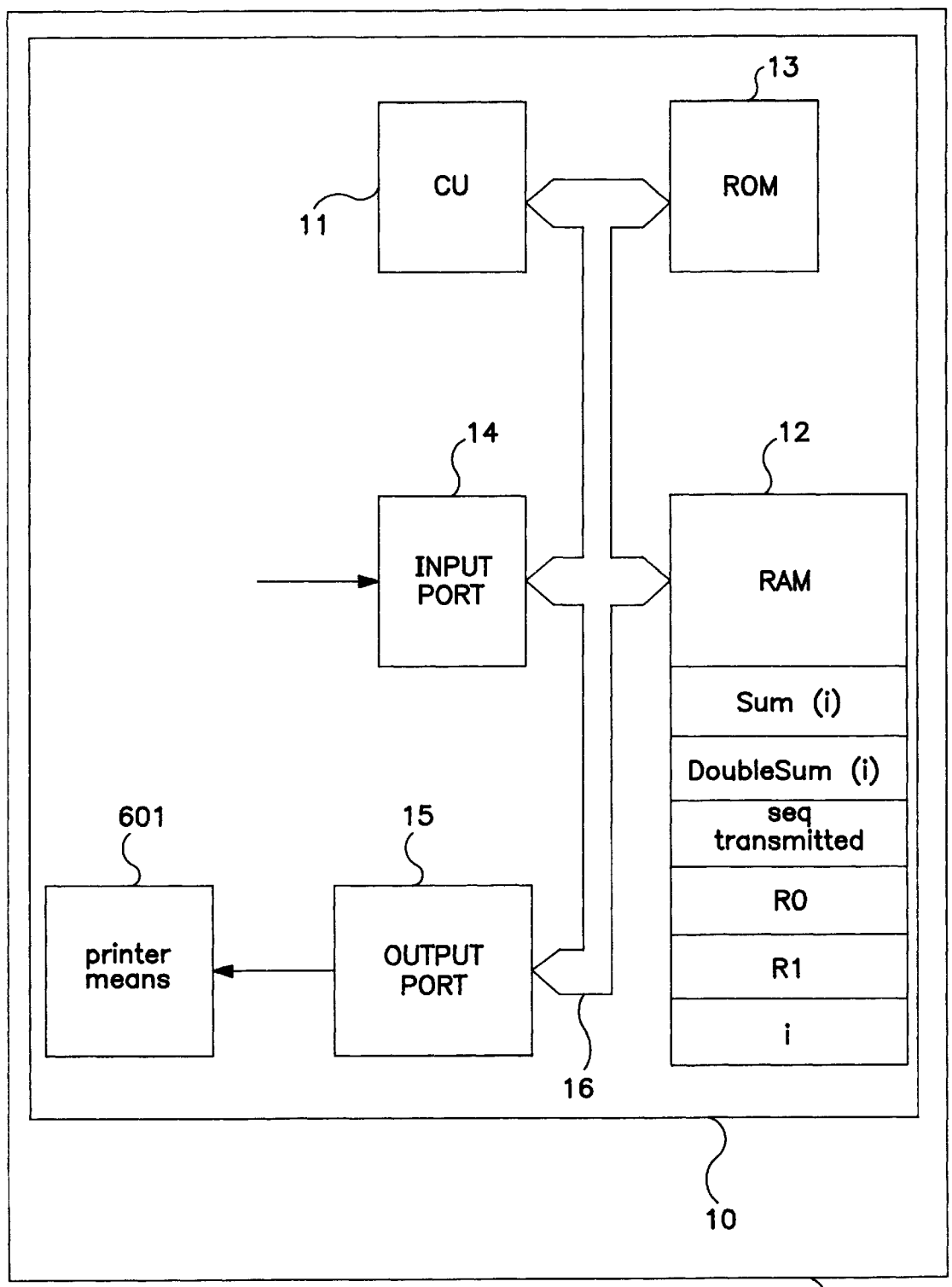
FIG. 6 represents a bar code printer incorporating a device according to the invention.
Figure 7:
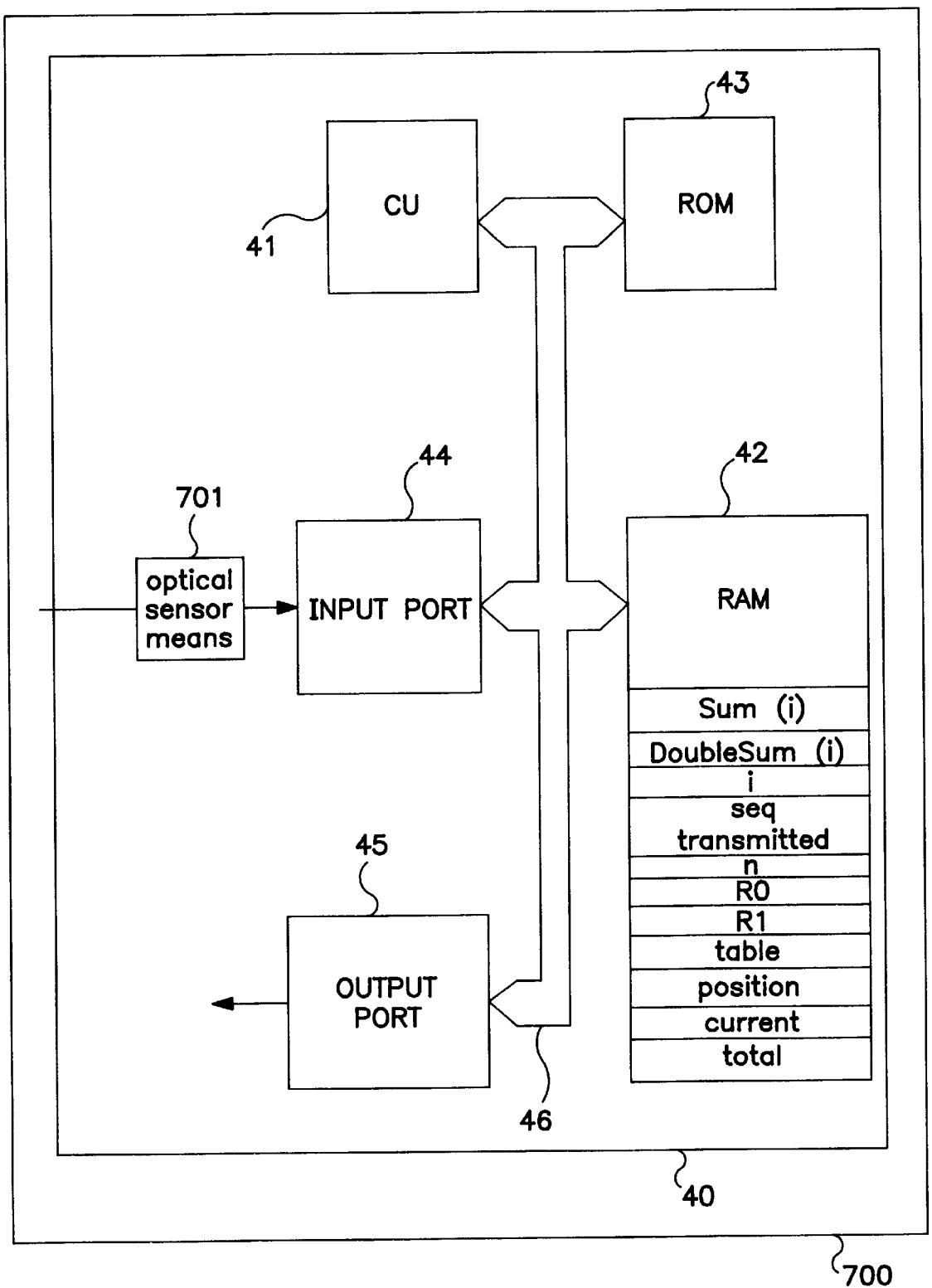
FIG. 7 represents a bar code reader incorporating a device according to the invention.
Figure 8A:
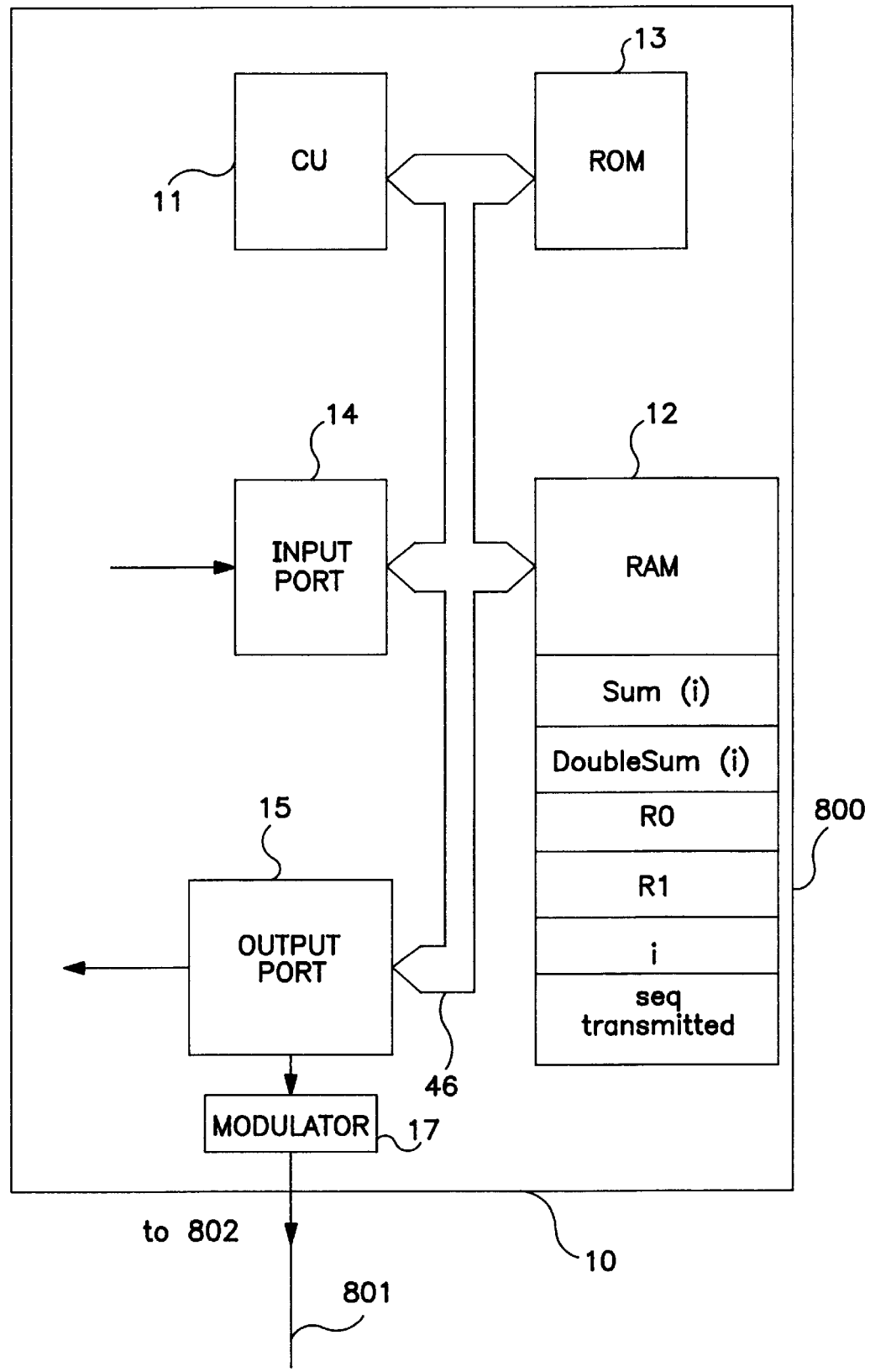
FIGS. 8A and 8b represent, respectively, a cable-connected transmitter and receiver incorporating a device according to the invention.
Figure 8B:
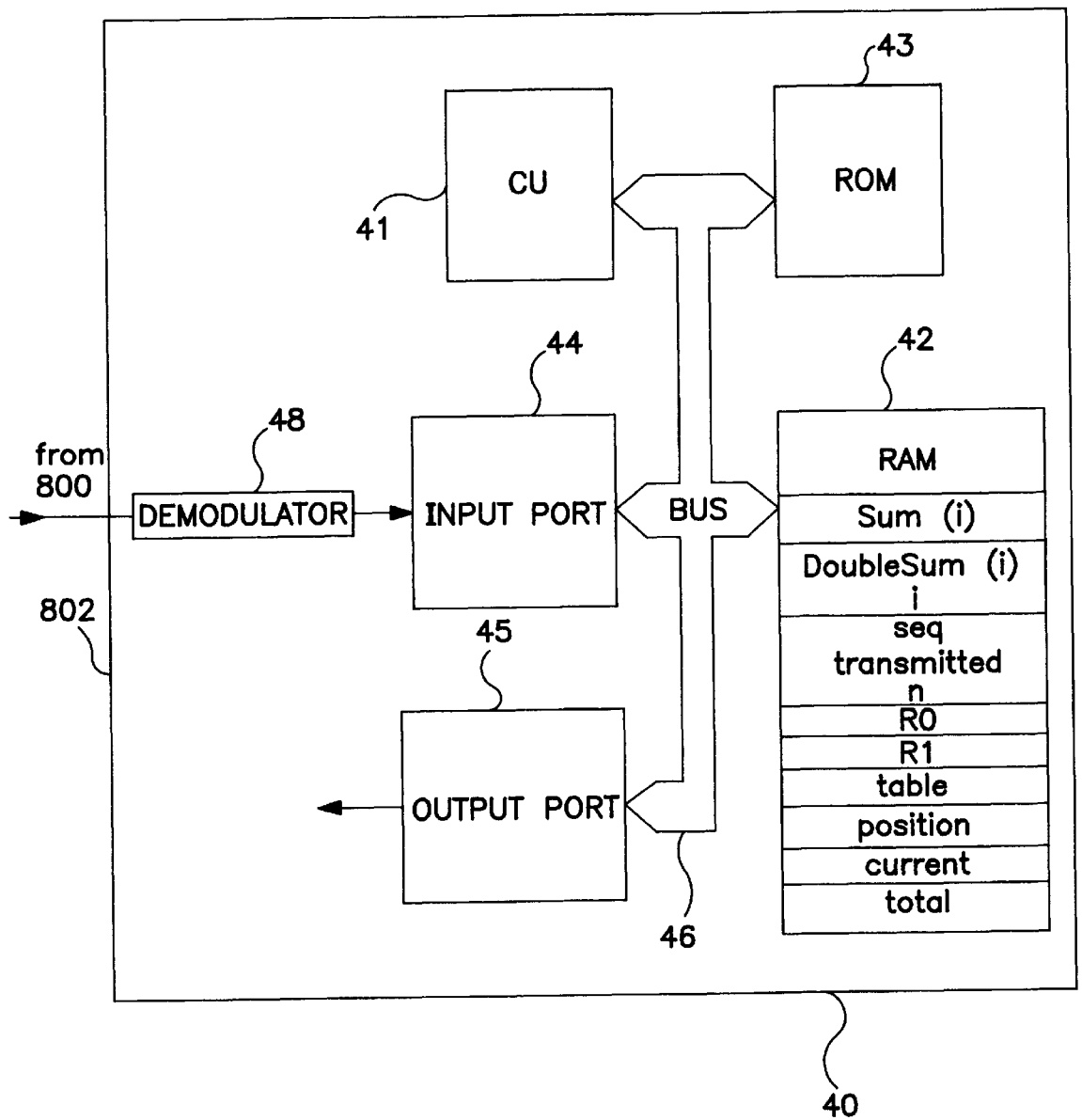
Figure 9A:
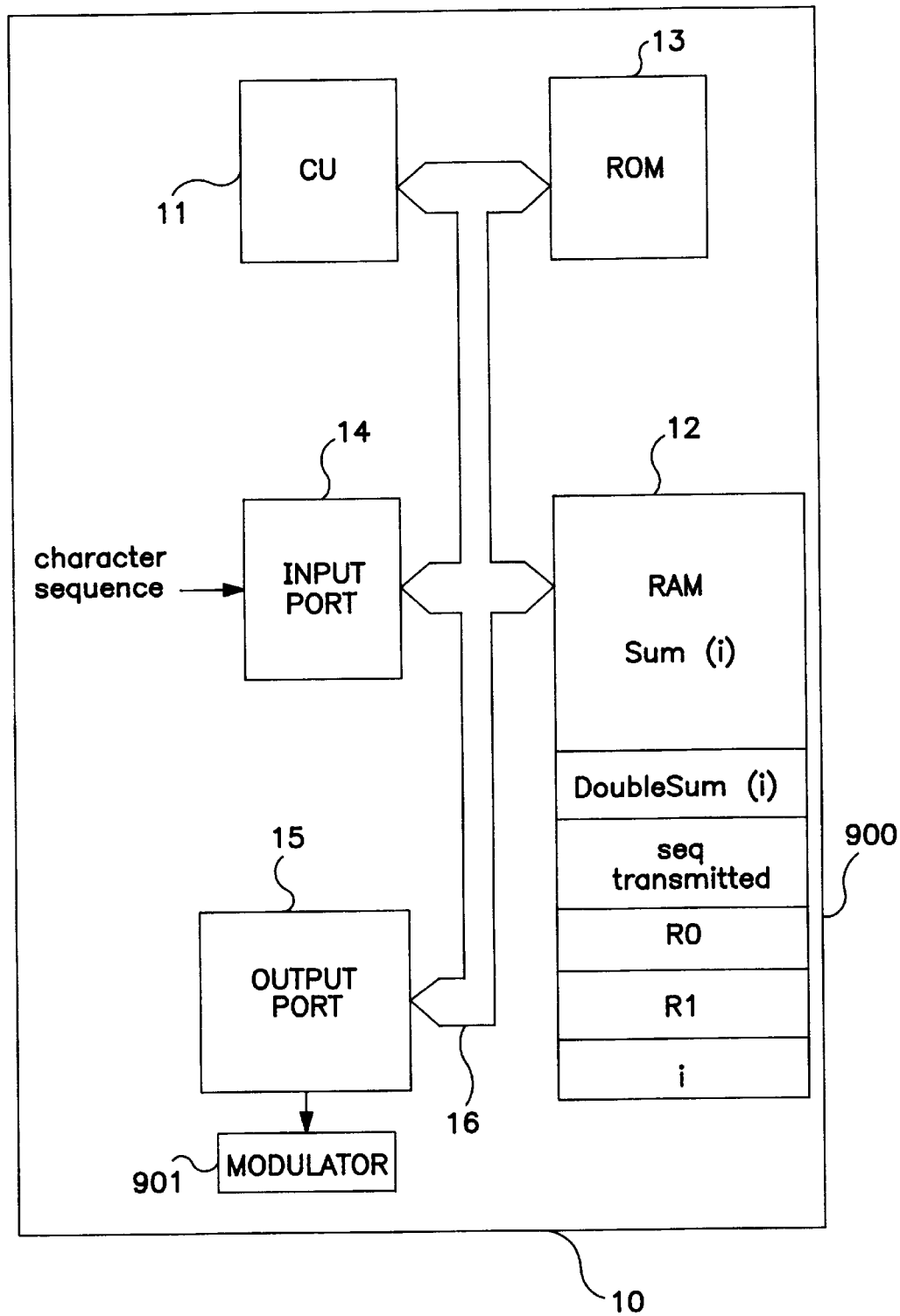
FIGS. 9A and 9B represent, respectively, a wireless transmitter and receiver incorporating a device according to the invention.
Figure 9B:
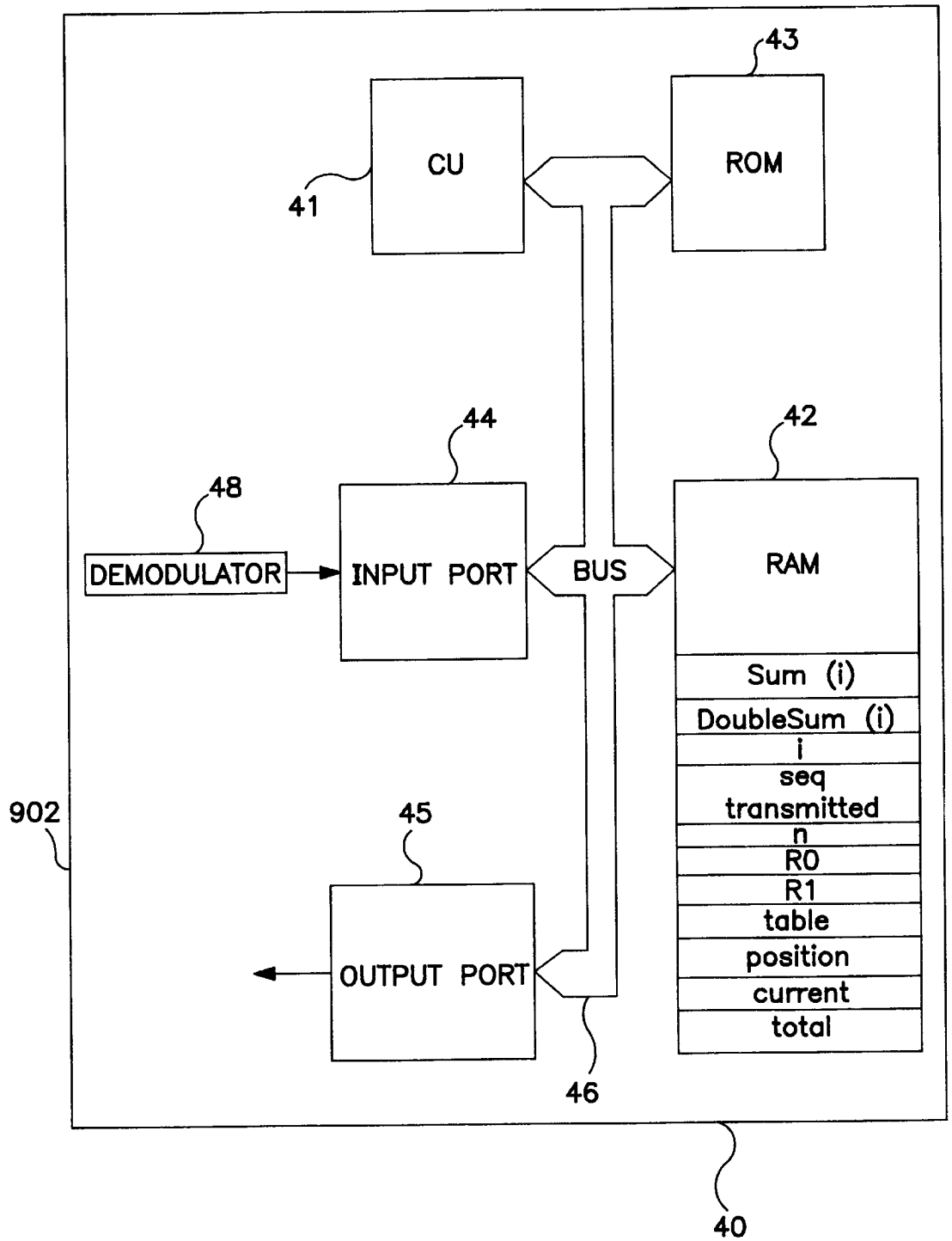

The modulator 17 modulates a predetermined physical quantity as a function of an electrical signal. The physical quantity can be the optical reflectance of a support, as illustrated in FIGS. 6 and 7, an electrical or optical signal travelling through a network, as illustrated in FIGS. 8a and 8b, or an acoustic, optical or electromagnetic signal, as illustrated in FIGS. 9a and 9b.

Figure 2:
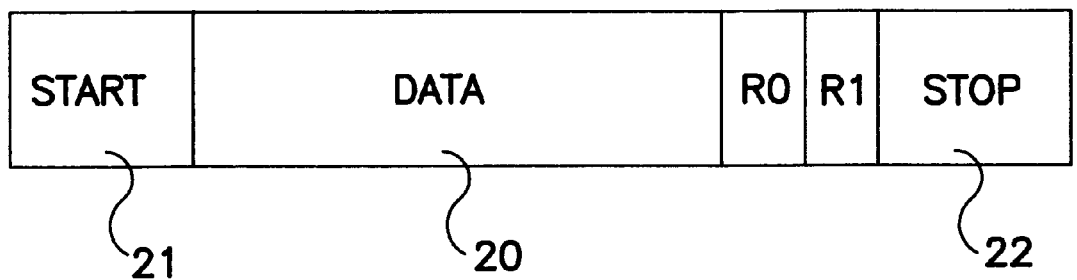
FIG. 2 is a representation of a sequence of numbers resulting from the implementation of a preferred embodiment of the method for calculating and generating coherence numbers.

FIG. 2 is a representation of a total transmitted sequence resulting from the implementation of an "encoding" phase described with reference to FIG. 3. Between a start delimiter (or character) 21 and an end delimiter 22, this total transmitted sequence includes, successively, the numbers of the initial sequence to be transferred 20 and two coherence numbers or redundancies R0 and R1.

The start delimiter 21 and stop delimiter 22 serve to indicate the ends of a message to a means of reading this message. They are of a type known to experts.

The coherence numbers R0 and R1 are calculated according to the method described with reference to FIG. 3, which gives a flow diagram of a program generating coherence numbers relating to the initial sequence to be transferred.

In general terms, according to the first aspect of the present invention, the coherence numbers R0 and R1 are chosen so that two predetermined "coherence check" combinations applied to the total transmitted sequence each give a predetermined modulo 67 value. The first, at least, of these coherence check combinations combining the numbers in the total transmitted sequence variably according to the position of each number in the total transmitted sequence.

More particularly, the coherence numbers R0 and R1 are chosen here so that on the one hand the sum, modulo 67, of all the numbers in the total transmitted sequence is nil (0 thus being the predetermined value corresponding to the second combination). On the other hand, R0 and R1 are also chosen so that the sum, modulo 67, of the numbers of the total transmitted sequence each multiplied by a "position" number is nil (0 thus being the predetermined value corresponding to the first combination). More precisely, the position number of each number in the total transmitted sequence is equal to a power of two whose exponent is the position of the said number in the total transmitted sequence, starting from the last (R1) and assigning to it the exponent 0.

The central processing unit 11 effects the resolution of the two-equation system resulting from these rules. After this "encoding" phase, the total transmitted sequence follows a "transfer" phase in the course of which it modulates a predetermined physical quantity, which is transferred and demodulated to form a total received sequence in which any "transmission" errors are searched for during a "decoding" phase.

Generally speaking, according to the first aspect of the invention, the decoding phase consists of applying the encoding phase combinations to the numbers in the total received sequence and, where the results of the said combinations are not equal to the said predetermined values corresponding to the said modulo 67 combinations, deducing therefrom that a transmission error has occurred and correcting it.

According to the method for calculating the coherence numbers R0 and R1 presented above, if the results of the combinations applied to the numbers in the total received sequence are nil, this means that the transfer has been correctly effected.

Otherwise, it is assumed that a single error has occurred in one of the binary words transferred, without changing the total number of binary symbols: if the result of the second combination gives an alpha number, the latter represents the error, and if the result of the first combination gives a beta number, beta divided by alpha gives the position number associated with the position of the erroneous number to which must be added the value of the error, alpha, in order to correct it.

In particular, the said division necessarily gives as a result a power of 2, the exponent of this power giving the position of the erroneous number, starting from R0, and going up through the total received sequence.

Knowing on the one hand the position and on the other hand the value of the error, it is clear that the method and device according to the invention make it possible to recover the correct numbers in the total transmitted sequence.

It can observed that, in order to implement a method according to the present invention, it therefore suffices to assign at least one series of "position" numbers biuniquely to the positions of the numbers in the total transmitted sequence and, in a first combination, multiply each of the numbers in this total transmitted sequence by the said position number.

Figure 3:
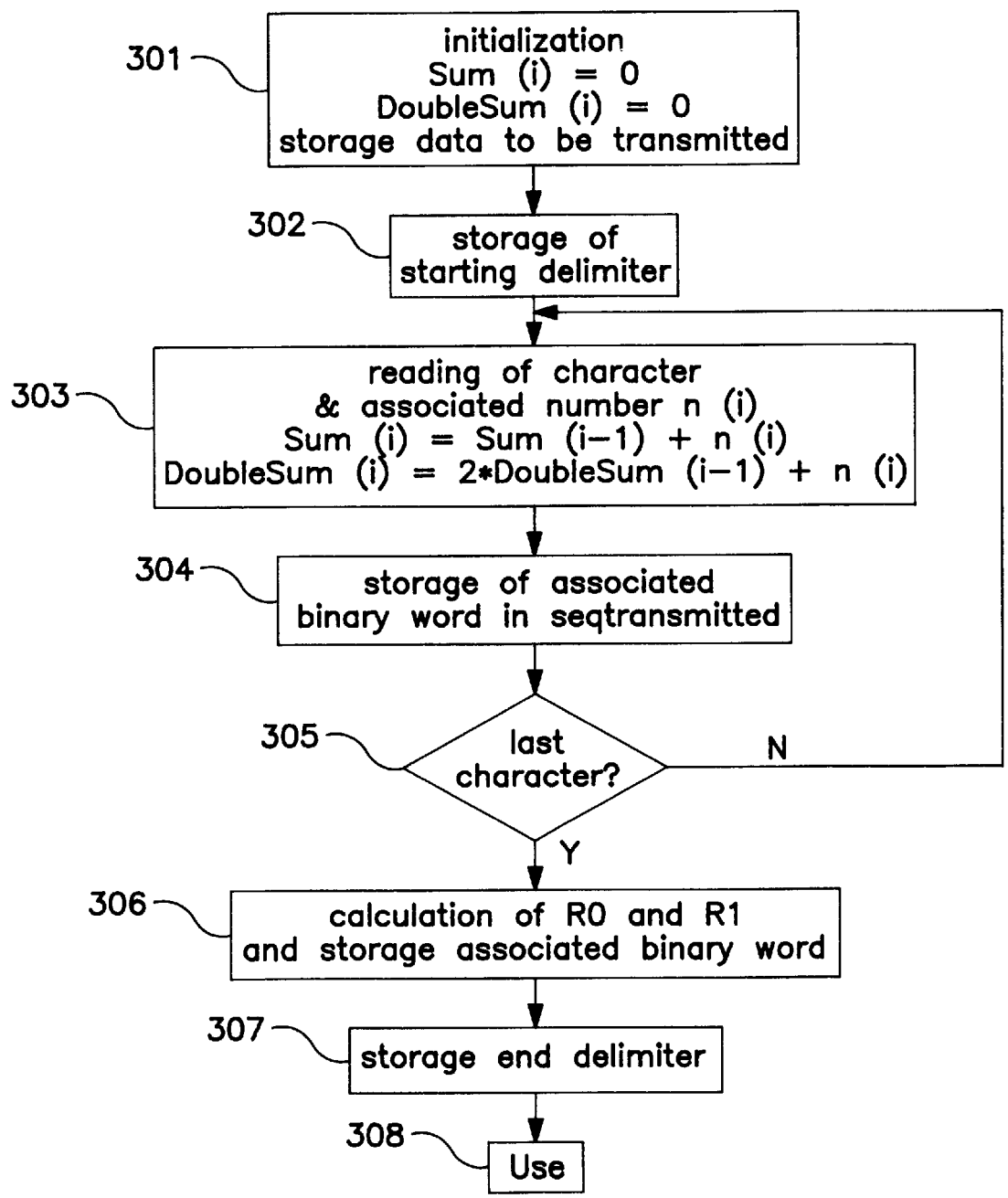
FIG. 3 is a flow diagram of a program generating coherence numbers relating to the sequence of numbers to be transferred.

FIG. 3 sets out in detail a flow diagram for a program generating coherence numbers relating to the data to be transferred according to the method described succinctly above. It is applied in particular to bar codes using an alphabet of fewer than 67 characters such that the character juxtapositions include, neither between themselves nor within themselves, sequences of more than four identical binary symbols. For applications not requiring such characteristics, the use of columns 1 and 5 in Table 1 will not be necessary.

The operation 301 consists of initialising the device according to the invention, more particularly by resetting to zero the variables i, Sum and DoubleSum in the registers of the RAM 12 and of entering in the RAM 12 the data to be transferred received by the central processing unit 11 through the input port 14. Next, the operation 302 consists of entering in the RAM 12, in the seq transmitted register, the binary word corresponding to the start delimiter 21, defined in the eighteenth line of Table 1. The following operation, marked 303, consists of reading the first available character in the RAM 12 whose number is i, starting from 0, and reading in Table 1, columns 2 and 6, the number n(i) associated with the said character. The integer n(i) is between 0 and 66. The operation 303 also consists of calculating the variable Sum(i) equal, modulo 67, to the sum of its preceding value and the integer n(i) and the variable DoubleSum(i), equal, modulo 67, to the sum of double its preceding value and the number n(i):

$$\text{Sum}(i) = \text{Sum}(i-1) + n(i) \qquad \text{(module 67)}$$

$$\text{DoubleSum}(i) = 2 \times \text{DoubleSum}(i-1) + n(i) \qquad \text{(module 67)}$$

The next operation 304 consists of entering in the same "seq transmitted" register as the start delimiter, following what is already stored there, the binary word corresponding to the integer n(i) which has just undergone operation 303, which binary word is given in columns 1 and 5 of Table 1.

Test 305 checks whether the character found in position i is the last character of the data to be transferred. If this is not the case, it increments the variable i by the value 1 and launches the following operation 303 with the character numbered i of the data to be transferred. If the test 305 is positive, the operation 306 consists of calculating the coherence numbers R0 and R1, which must solve the two-equation system in which they are the two unknown quantities:

$$\text{Sum}(i) + R0 + R1 = 0 \qquad \text{(module 67)}$$

$$4 \times \text{DoubleSum}(i) + 2 \times R0 + R1 = 0 \qquad \text{(modulo 67)}$$

of which it will be observed that the determinant is not nil, and which therefore has one solution and one solution only. The operation 306 also consists of storing, after the binary words in the initial sequence and in the seq transmitted register, the two binary words corresponding, with the use of Table 1, to the two coherence numbers R0 and R1, in order to form a "total transmitted sequence". The operation 307 stores, after these two coherence numbers and still in the seq transmitted register, a binary word corresponding to an end delimiter 22, given in the fifteenth line of Table 1. The operations 302 to 307 constitute the "encoding" phase of the initial sequence in a total transmitted sequence.

Finally, the operation 308 consists of transferring the total transmitted sequence by transferring, in the order of storage in the seq transmitted register, the data present in the latter, to the modulator 17, through the output port 15. The modulator 17 then modulates a predetermined physical quantity by the binary data representing the total transmitted sequence.

Figure 4:
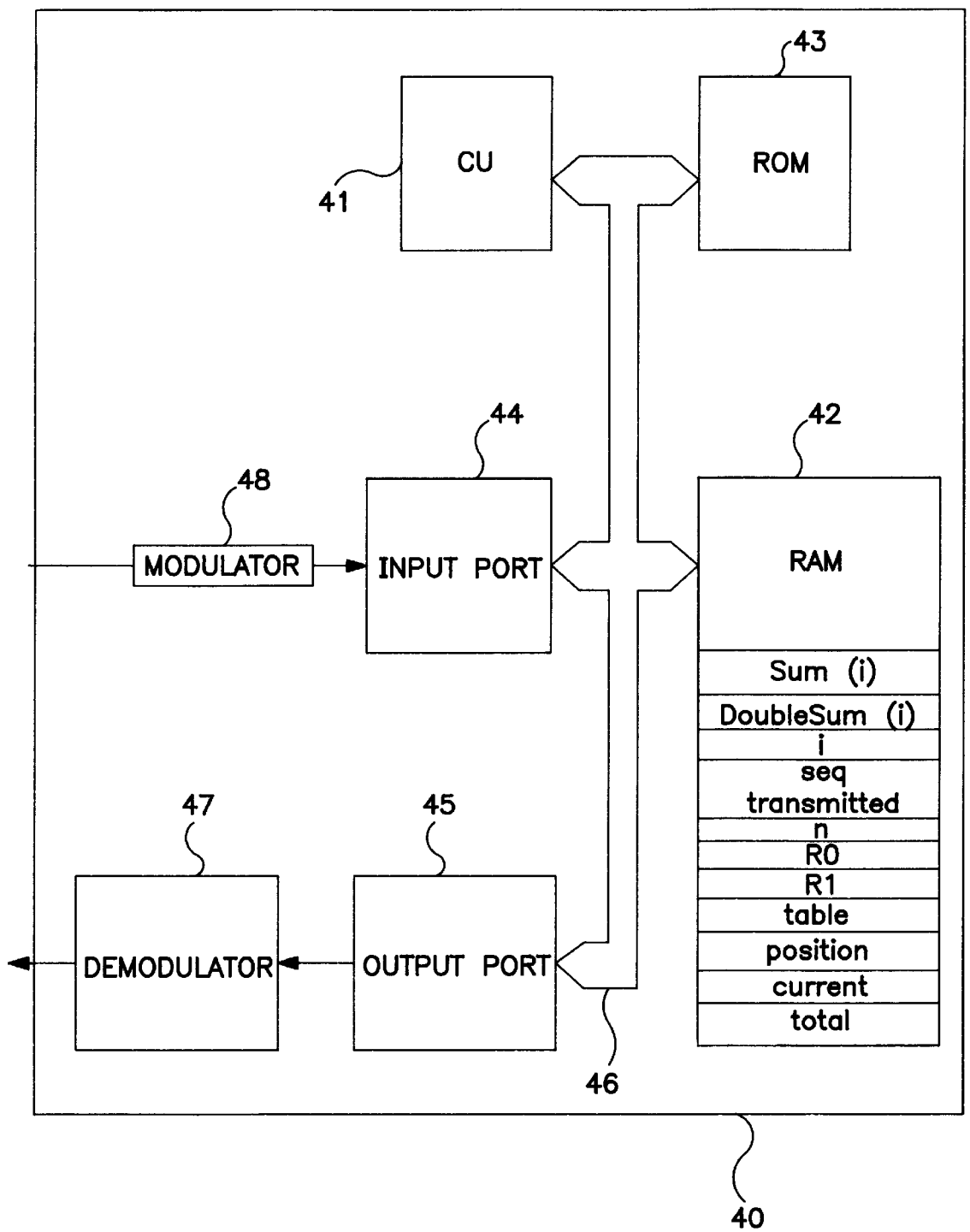
FIG. 4 is a block diagram of a device for generating coherence numbers according to a second aspect of the invention, and for determining errors according to this second aspect.

Following the "transfer" phase, consisting, in addition to the operation 308, of the transfer of the physical quantity and the demodulation of the physical quantity, the binary words of the total transmitted sequence are received in the form of a total "received" sequence by a reception device illustrated in FIG. 4, and are processed according to the method of the invention. The error detection and correction process is presented with reference to FIGS. 5a, 5b and 5c, according to the two aspects of the invention.

A description will now be given, with reference to FIG. 4, of a block diagram of a device for determining errors according to the two aspects of the invention. This device is represented by the general reference number 40. It includes, connected to one another by an address and data bus 46:

- a central processing unit 41,
- a RAM 42,
- a ROM 43,
- an input port 44 serving to receive a total received sequence,
- a demodulator 48 for demodulating the physical quantity into binary data,
- an output port 45 enabling the device to transfer, respectively, the corrected sequence originating from the processing of the total received sequence,
- a modulator 47 for modulating binary data into a predetermined physical quantity.

The generation of the coherence numbers having already been described above, it is not explained again here. As regards error detection and correction, the RAM 42 has in particular a register in which is stored the total received sequence currently being processed, as well as ten registers storing ten groups of variables described below, Sum, DoubleSum, i, position, n, table, total and current. The ROM 43 is adapted to store the operating program of the device and of the central processing unit 41 so that the central processing unit 41 is adapted to implement all the operations set out in the flow chart in FIG. 5. It also includes the tables as described in the attached documents.

The modulator 47 modulates a predetermined physical quantity as a function of an electrical signal issuing from the output port 45 and representing binary data. The physical quantity can be the optical reflectance of a support, as illustrated in FIGS. 6 and 7, an electrical or optical signal travelling through a network, as illustrated in FIGS. 8a and 8b, or an acoustic, optical or electromagnetic signal, as illustrated in FIGS. 9a and 9b. The demodulator 48 transmits an electrical signal representing binary data to the input port 44, as a function of the physical quantity modulated by the modulator 17.

This configuration is known to information technology systems experts and is therefore not described in greater detail here.

In general terms, the second aspect of the invention applies to the detection and correction of the errors which have occurred owing to the addition or subtraction of one or more binary symbols during the transfer of a "total transmitted" sequence of numbers each representing a number N of binary symbols modulating a predetermined physical quantity, the said total transmitted sequence including at least two "coherence" numbers adapted, according to a "location and evaluation" process, to allow the rectification of any error. It should be noted that, here, location and evaluation process means any process allowing the detection and correction of a transmission error consisting of the replacement of a number represented by N binary symbols with an erroneous number also represented by N binary symbols. By way of example constituting a particular embodiment of the present invention, the method according to the first aspect of the invention constitutes a location and evaluation process.

The method according to the invention then consists, in a "counting" phase, of counting the number of binary symbols in the total received sequence originating from the demodulation of the physical quantity representing the total transmitted sequence and, where this number is a multiple of N, of implementing the said location and evaluation process, where this number is equal to a multiple of N, minus an integer j less than half of N, in a "replacement" phase, of replacing, in the total received sequence and successively, groups of N−j consecutive binary symbols with groups of N "replacement" binary symbols, and, in a "validation" phase, determining whether this replacement is correct by implementing the location and evaluation process, where this number is equal to a multiple of N, minus an integer j less than half of N, in a "replacement" phase, of replacing, in the total received sequence and successively, groups of N+j consecutive binary symbols with groups of N "replacement" binary symbols, and, in a "validation" phase, of determining whether this replacement is correct by implementing the location and evaluation process.

More particularly, when the location and evaluation process is that of the first aspect of the invention, the object of the invention is also a method for detecting and correcting any error in the transmission of a "total transmitted" sequence of fewer than 67 numbers each represented by 7 binary symbols modulating a predetermined physical quantity, the said total transmitted sequence including at least two "coherence" numbers according to the first aspect of the invention, characterised in that, in a "counting" phase, it consists of counting the number of binary symbols in the total received sequence originating from the demodulation of the physical quantity representing the total transmitted sequence and, where this number is a multiple of 7, implementing the method according to the first aspect of the invention, where this number is equal to a multiple of 7, minus 1, in a "replacement" phase, of replacing, in the total received sequence and successively, groups of 6 consecutive binary symbols with groups of 7 "replacement" binary symbols, and, in a "validation" phase, determining whether this replacement is correct by implementing the method according to the first aspect of the invention, where this number is equal to a multiple of 7, plus 1, in a "replacement" phase, of replacing, in the total received sequence and successively, groups of 8 consecutive binary symbols with groups of 7 "replacement" binary symbols, and, in a "validation" phase, determining whether this replacement is correct by implementing the method according to the first aspect of the invention.

In this particular embodiment, the decoding phase according to the first aspect of the invention having already been described with reference to FIG. 2, the description endeavours here to present the decoding phase according to the second aspect of the invention.

Counting-down of the binary symbols received makes it possible to know whether one, two or more binary symbols have been added to or subtracted from the total transmitted sequence by the transfer. The counting-down can give the following results:

the number of binary symbols is a multiple of 7, in which case decoding according to the first aspect of the invention is applied;

one binary symbol is missing from the total received sequence, in which case the method according to the second aspect of the invention consists, in a "replacement" phase, of adding a binary symbol successively to each group of six consecutive binary symbols followed and/or preceded solely in the total received sequence by groups of seven binary symbols. The said six original binary symbols together with the added binary symbol constitute a number called the replacement number. Then, in a "validation" phase, error detection and correction is applied to the total received sequence thus constituted, by following the decoding phase according to the first aspect of the invention.

If the decoding phase gives an error which is indeed at the position of the replacement number, the correction of the said error in this replacement number finishes the correction of the total received sequence;

If the error is not in the replacement number, the process passes to the next group of six binary symbols in the total received sequence as demodulated, until all possible groups have been tested;

two binary symbols are missing from the total received sequence, in which case the method according to the second aspect of the invention consists, in a "replacement" phase, of adding two binary symbols successively to each group of five consecutive binary symbols followed and/or preceded solely in the total received sequence by groups of seven binary symbols. The said five original binary symbols together with the two added binary symbols constitute a number called a replacement number. Then, in a "validation" phase, error detection and correction is applied to the total received sequence thus constituted, by following the decoding phase according to the first aspect of the invention.

If the decoding phase gives an error which is indeed at the position of the replacement number, the correction of the said error in this replacement number finishes the correction of the total received sequence;

If the error is not in the replacement number, the process passes to the next group of five binary symbols in the total received sequence as demodulated, until all possible groups have been tested;

there is one binary symbol too many in the total received sequence, in which case the method according to the second aspect of the invention consists, in a "replacement" phase, of subtracting one binary symbol successively from each group of eight consecutive binary symbols followed and/or preceded solely in the total received sequence by groups of seven binary symbols. The said eight original binary symbols from which the binary symbol has been subtracted constitute a number called a replacement number. Then, in a "validation" phase, error detection and correction is applied to the total received sequence thus constituted, by following the decoding phase according to the first aspect of the invention.

If the decoding phase gives an error which is indeed at the position of the replacement number, the correction of the said error in this replacement number finishes the correction of the total received sequence;

If the error is not in the replacement number, the process passes to the next group of eight binary symbols in the total received sequence as demodulated, until all possible groups have been tested;

there are two binary symbols too many in the total received sequence, in which case the method according to the second aspect of the invention consists, in a "replacement" phase, of subtracting two binary symbols successively from each group of nine consecutive binary symbols followed and/or preceded solely in the total received sequence by groups of seven binary symbols. The said nine original binary symbols from which the two binary symbols have been subtracted constitute a number called a replacement number. Then, in a "validation" phase, error detection and correction is applied to the total received sequence thus constituted, by following the decoding phase according to the first aspect of the invention.

If the decoding phase gives an error which is indeed at the position of the replacement number, the correction of the said error in this replacement number finishes the correction of the total received sequence;

If the error is not in the replacement number, the process passes to the next group of nine binary symbols in the total received sequence as demodulated, until all possible groups have been tested;

and so on for three added or subtracted binary symbols in the total received sequence.

It should be noted that in this method, each replacement which is not validated is cancelled by an inverse replacement so that the following replacement acts on the total received sequence as demodulated.

Figure 5A:
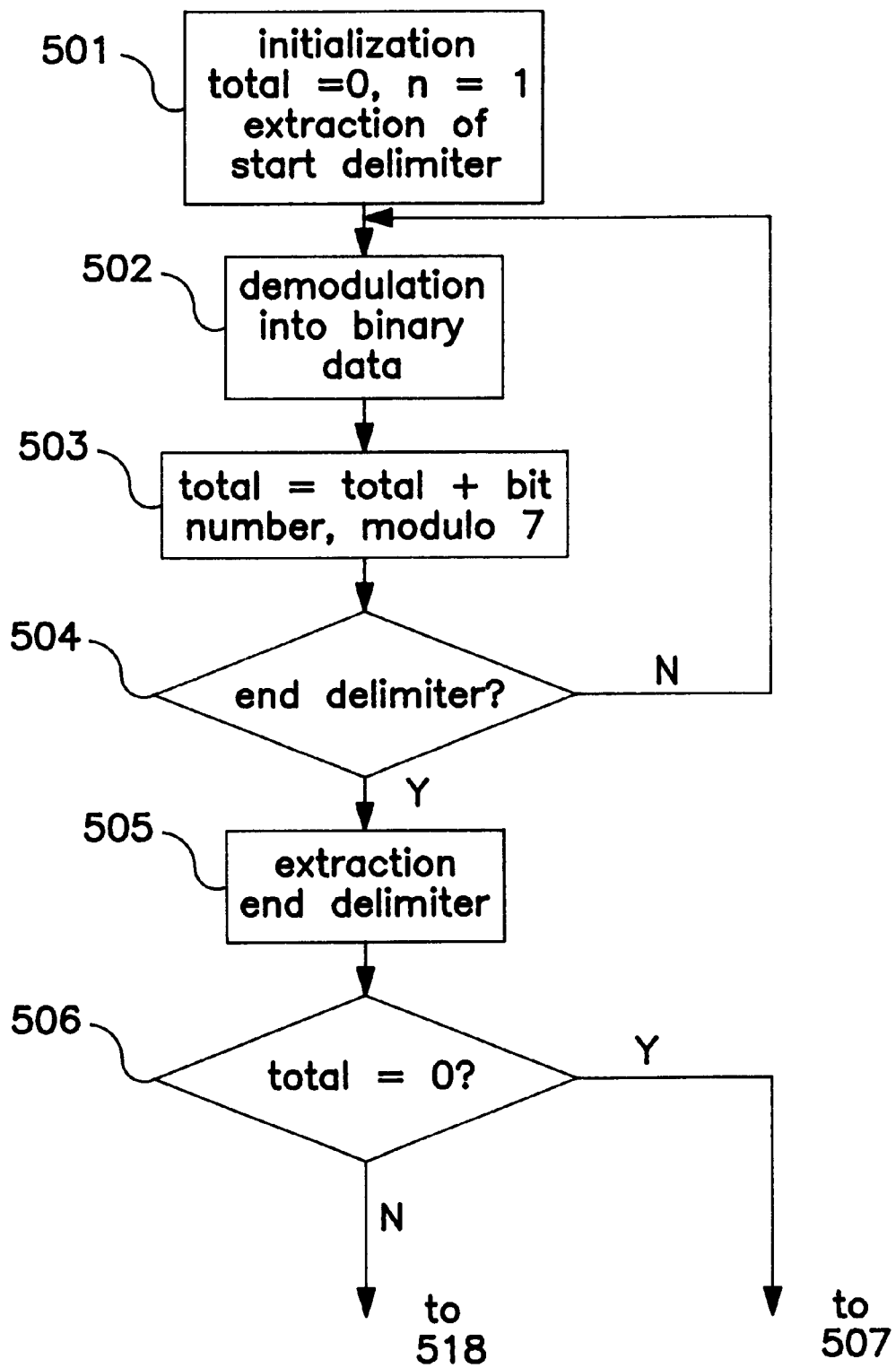
FIGS. 5a, 5b and 5c represent the flow diagram of the program effecting the decoding of the coherence numbers relating to the transferred sequence, the determining of transmission errors, and their correction.
Figure 5B:
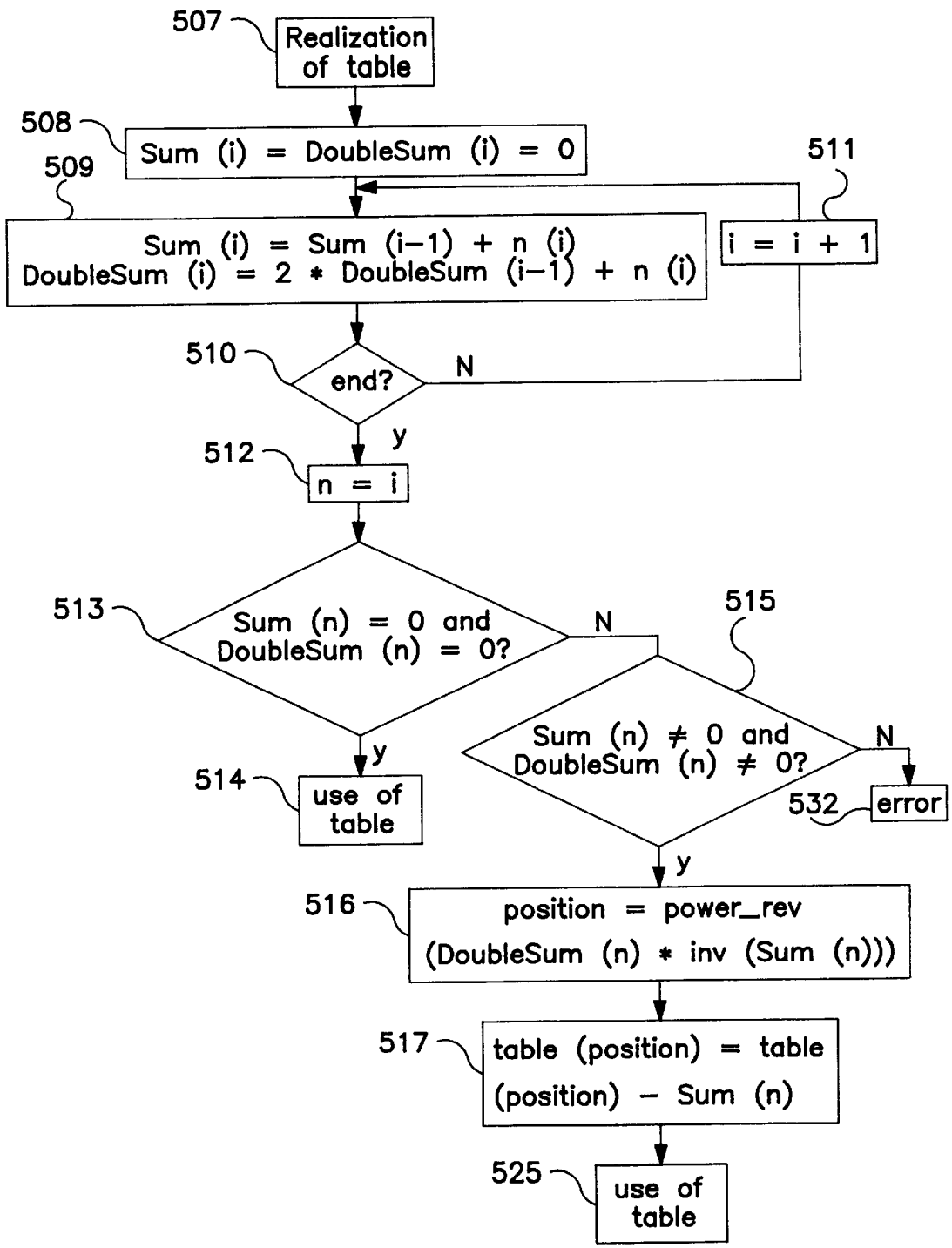
Figure 5C:
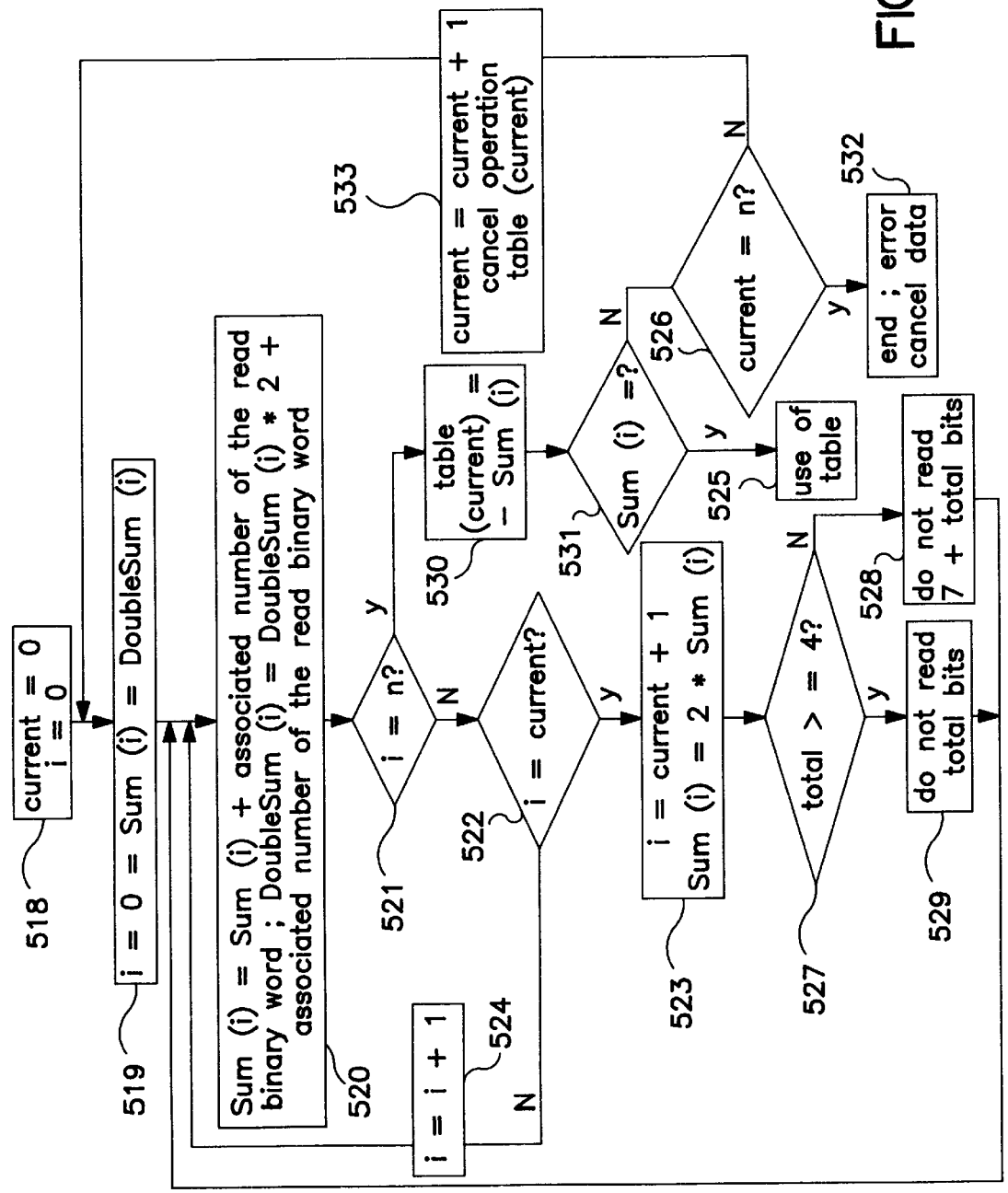

FIGS. 5a, 5b and 5c depict the flow diagram of the program effecting the use of the coherence numbers relating to the total received sequence, and the determination of transmission errors as well as the correction thereof for a device as illustrated in FIG. 4.

In FIG. 5a, the operation 501 consists of the initialization of the device, the variables being set at total=0 and n=1. The device demodulates the physical quantity into binary data and extracts the start delimiter 21. The operation 502 consists of demodulating the predetermined physical quantity into binary data.

The operation 503 consists of adding, in the total register, to the value of the total variable, the number of binary symbols of the character being read, modulo 7. Test 504 checks, on the one hand, whether at least five consecutive binary symbols are nil and, on the other hand, whether the last group of seven binary symbols whose last symbol is not nil, is the binary word associated with the end delimiter (see fifteenth line of table 1, column 1: 0100101). If at least one of these conditions is not fulfilled, the central processing unit 41 returns to the operation 503, effected on the following character. If test 504 is positive, operation 505 consists of extracting the end delimiter and the binary symbols following it and subtracting the number of these binary symbols and of those of the end delimiter of the total variable. The test 506 checks whether the total variable is equal to zero, that is to say whether the total number of binary symbols constituting the total received sequence is a multiple of 7. If the test 506 is positive, the operation 507 (FIG. 5b) is implemented. If not, the operation 518 (FIG. 5c) is implemented. The "counting" phase is thus constituted by the operations 503, 504, 505 and 506. The "decoding" phase corresponds to the operations 507 to 517 presented below.

The operation 507 consists of creating a table which includes in each position a septuplet of binary symbols taken in the order in which they were read. The table of variables table also includes integers n (i), n (i) corresponding respectively to the septuplets of binary words from 0 to 66. The operation 508 consists of resetting to zero the values of three groups of variables, Sum(i), DoubleSum(i) and i, representing the position of a septuplet in the table of variables table. The operation 509 effects the calculation of Sum(i) and DoubleSum(i) in the following manner:

$$\text{Sum}(i)=\text{Sum}(i-1)+n(i) \quad \text{(module 67)}$$

$$\text{DoubleSum}(i)=2\times\text{DoubleSum}(i-1)=n(i) \quad \text{(modulo 67)}$$

The test 510 tests whether the table of variables table has been read in full. If not, the operation 511, which increments the value of i by one unit, precedes the repetition of the operation 509. If the test 510 is positive, the operation 512 assigns the value i to the variable n, n thus being the number of elements in the total received sequence.

Next, the test 513 checks that DoubleSum(n) and Sum(n) are both nil. If so, the error detection shows that there is no transmission error and the program comes out of error correction and proceeds to use the corrected total received sequence, which use is not described here. The test 515 tests whether DoubleSum(n) and Sum(n) are both not nil. If the test 515 gives a negative result, an error message is transmitted by the central processing unit 41, and the latter goes to the operation 532 presented later on. This message means that two transmission errors have occurred but that the device according to the invention cannot correct them. If the test 515 gives a positive result, the operation 516 calculates the variable position as the product, modulo 67, of DoubleSum(n) and the inverse of Sum(n), which inverse is given in column 2 or 4 of the appended table 4, where Sum(n) is found in column 1 or 3 of this table. To this end, the operation 516 consists of taking, using Table 3, the logarithm to the base 2 of the variable position, which logarithm is equal to the position of the erroneous number starting from the last number in the total received sequence. The operation 517 consists of changing the number of the table which is found at the said position by subtracting from it the error equal to Sum(n). In this fashion, error correction has been effected and the central processing unit goes to the operation 525 of using the sequence given in the table of variables table.

The operation 518 resets to zero the variables current and i. The operation 519 resets to zero the variables i, Sum(i) and DoubleSum(i). The operation 520 effects the calculations corresponding to the following equations, enabling the values of the variables Sum(i) and DoubleSum(i) to be calculated:

$$\text{Sum}(i)=\text{Sum}(i-7)+n(i) \quad \text{(modulo 67)}$$

$$\text{DoubleSum}(i)=2\times\text{DoubleSum}(i-1)+n(i) \quad \text{(modulo 67)}$$

The following test 521 tests whether the variable i is equal to the variable n. If the result of the test 521 is negative, the test 522 tests whether the variable i is equal to the variable current. If the result of the test 522 is negative, the operation 524 increments the value of i by one unit and the operation 520 calculates the new values of the variables Sum(i) and DoubleSum(i), and precedes reimplementation of the test 521.

If the test 522 gives a positive result, the operation 523 consists of assigning to the variable i the value of the variable current plus 1, and to the variable DoubleSum(i), twice the value of the preceding DoubleSum(i) variable. The test 527 tests whether the variable total is greater than or equal to 4. If the result of the test 527 is positive, the operation 529 consists of not reading a total number of binary symbols, but of reading seven nil binary symbols which constitute a group of 7 "replacement" binary symbols. If the result of the test 527 is negative, the operation 528 consists of not reading a number 7 plus total binary symbols, but of reading seven nil binary symbols which constitute a group of 7 replacement binary symbols. Following either one of these two steps, the binary words stored in the table table are re-evaluated, that is to say separated from the number of binary data items which have not been read in order to reconstitute a "received" sequence including a good number of multiple-of-7 binary data items. The "replacement" phase is constituted here by the operations 527, 528 and 529. After one of the two operations 528 or 529, the operation 520 is re-executed.

If the test 521 gives a positive result, the operation 530 assigns the value -Sum(i), modulo 67, to the variable in the table bearing the number equal to the variable current. Next, the test 531 tests whether the variable DoubleSum(i) is equal to the value Sum(i) multiplied by the power of 2 whose exponent is n minus 2 minus current. If the result of the test 531 is positive, error correction is terminated and the operation 525 consists of the use of the table. Otherwise, the test 526 tests whether the value of the variable current is equal to the value of the variable n. If the result of this test is positive, the operation 532 consists of resetting the variables in the RAM to zero and erasing the binary symbols representing the total received sequence. If the result of test 526 is negative, the operation 533 effects the operation which is the inverse of the operation 530 and restores the variable in the table which bears the number equal to the variable current to its value originating from the total received sequence, and increments the value of the variable current by one unit, and then goes back to the operation 519. The "validation" phase is constituted here by the operations and tests 520, 521, 522, 524, 526, 530, 531 and 533. Error correction is terminated either by the operation 532, it not having been possible to correct the error or errors, or by the operation 514, no error having been detected, or else by the operation 525, the error having been corrected.

It can be observed that the first aspect of the invention relates to error correction in numbers without modification of the number of binary symbols representing them, and corresponds to the operations 507 to 517 inclusive. Further, the other operations 520 to 535 relate to the same correction extended to the case of the erroneous addition or subtraction of binary symbols.

FIG. 6 depicts a bar code printer incorporating a device according to the invention. In FIG. 6 are depicted a bar code printer 600 incorporating the elements presented in FIG. 1 and a printing means 601. The bar code printer 600 can, for example, be of a known type. The printing means can work in particular with a laser, with one or more ink jets, or with a thermal transfer ribbon.

FIG. 7 depicts a bar code reader incorporating a device according to the invention. In FIG. 7 are depicted a bar code reader 700 incorporating the elements presented in FIG. 4 and a means 701 of optically scanning the bars constituting the said bar code. This optical scanning means 701 can include either a photosensitive matrix scanner including several lines of photosensitive dots, or a photosensitive linear scanner including, on a line, a series of photosensitive dots, or alternatively a photosensitive scanner including only a single photosensitive zone, and which is moved in front of the bar code to be scanned.

It should be noted that the bar codes used can be either matrix in form, that is to say comprising a two-dimensional network with high-reflectance zones and low-reflectance zones, or linear, that is to say comprising a series of parallel lines of low and high reflectance.

FIGS. 8a and 8b depict, respectively, a cable transmitter and receiver, each incorporating a device according to the invention. In FIG. 8a are depicted a transmitter 800 incorporating all the elements in FIG. 1, including the modulator 17 connected to the output port 15 and a cable network 801 and, in FIG. 8b, a receiver 802 incorporating all the elements in FIG. 4, including a demodulator 48 connected to the input port 44 and to the cable network 801.

The modulator 17 translates the electrical pulses arriving from the output port 15 into pulses on a physical quantity conveyed by a cable network 801. This physical quantity can, for example, be electrical, difference in potential, amperage, frequency or phase, or else can be optical, light intensity, wavelength, frequency or phase. The demodulator 48 translates the variations in the predetermined physical quantity into binary symbols.

FIGS. 9a and 9b depict, respectively, a transmitter and receiver for wireless transmission incorporating a device according to the invention. In FIG. 9a are depicted a transmitter 900 incorporating all the elements in FIG. 1, including a modulator 901 connected to the output port 15, and, in FIG. 9b, a receiver 902 incorporating all the elements in FIG. 4, including a demodulator 48 connected to the input port 44.

The modulator 901 can, for example, transmit an electromagnetic signal, a light signal, or alternatively an acoustic signal. The demodulator 48 translates the variations in the predetermined physical quantity into binary symbols.

The present invention is of course not in the least limited to the embodiments described with reference to the Figures, but quite the contrary includes all variations within the grasp of experts.

In particular, the second aspect of the invention applies to all the decoding and error detection and correction methods, also referred to above as location and evaluation processes, which are at present limited to the modification of numbers without modification of the number of their constituent binary symbols.

It can also be observed that the second combination can also combine the numbers of the total transmitted sequence variably as a function of the position of each number in the total transmitted sequence. In particular, the application of a second series of position numbers, not necessarily biuniquely, allows the invention to be employed, but with generally slower error-correction means, since the solution of the equation system allowing the error to be measured and its position to be determined is more complex. The possible two series of position numbers must be such that the divisions, modulo 67, of a number in the first series by the number in the same row in the second series are all different.

Finally, it can be observed that, in the above description, 64 can be replaced by a number at most P-3, where P is a predetermined natural number replacing 67.

However, preferably P should be a prime number so that the "initial" sequence could have P-3 numbers. Particularly, P should have a primitive number Q, so that:

in operations 303, 509 and 520, the multiplicative factor 2 used for calculating DoubleSum be replaced by Q;

the calculation of the Table 1, Table 2 and Table 3, using said number Q instead of the number 2.

More particularly the primitive number of P should be 2.

We claim:

1. Method for detecting and correcting any transmission error in an "initial" sequence of at most P-3 numbers, where P is a predetermined natural number, representing binary data modulating a predetermined physical quantity, characterised in that, successively:

an "encoding" phase consists of adding to the initial sequence two "coherence" numbers to form a "total transmitted" sequence, the two coherence numbers being determined so that two predetermined "coherence check" combinations applied to a total transmitted sequence each give a predetermined modulo P value, at least a first one of the said combinations combining the numbers in the total transmitted sequence variably as a function of the position of each number in the total transmitted sequence, a "transfer" chase consists of the physical quantity being modulated by the total transmitted sequence, transferred and demodulated to form a total "received" sequence, a "decoding" phase consists of applying the said combinations to the numbers of the total received sequence and, where the results of the said combinations are not equal to the said predetermined modulo P values, deducing therefrom that a transmission error has occurred and correcting it, characterised in that P is a prime number.

2. Method according to either claim 1, characterised in that P has a primitive number.

3. Method according to claim 2, characterized in that 2 is a primitive number of P.

4. Method according to claim 1, characterised in that a second one of the said combinations combines the numbers in the total transmitted sequence independently of their position in the total transmitted sequence.

5. Method for detecting and correcting any error in the transfer of a "total transmitted" sequence of less than P numbers each represented by N+1 binary symbols modulating a predetermined physical quantity, the said total transmitted sequence including at least two "coherence" numbers according to claim 1, characterised in that:

in a "counting" phase, it consists of counting the number of binary symbols in the total received sequence originating from the demodulation of the physical quantity representing the total transmitted sequence, and, where this number is equal to a multiple of N+1, minus 1, in a "replacement" phase, of replacing, in the total received sequence and successively, groups of N consecutive binary symbols with groups of N+1 "replacement" binary symbols, and, in a "validation" phase, of determining whether the position of this replacement is correct by using the decoding phase according to the said claim.

6. Method for detecting and correcting any error in the transfer of a "total transmitted" sequence of less than P numbers each represented by N+1 binary symbols modulating a predetermined physical quantity, the said total transmitted sequence including at least two "coherence" numbers according to claim 2, characterised in that:

in a "counting" phase, it consists of counting the number of binary symbols in the total received sequence originating from the demodulation of the physical quantity representing the total transmitted sequence, and, where this number is equal to a multiple of n+1, plus 1, in a "replacement" phase, of replacing in the total received sequence and successively, groups of N+2 consecutive binary symbols with groups of N+1 "replacement" binary symbols, and, in a "validation" phase, of determining whether the position of this replacement is correct by using the decoding phase according to the said claim.

7. Method for detecting and correcting any transmission error in an "initial" sequence of at most P-3 numbers, where P is a predetermined natural number, representing binary data modulating a predetermined physical quantity, characterised in that, successively:

an "encoding" phase consists of adding to the initial sequence two "coherence" numbers to form a "total transmitted" sequence, the two coherence numbers being determined so that two predetermined "coherence check" combinations applied to a total transmitted sequence each give a predetermined modulo P value, at least a first one of the said combinations combining the numbers in the total transmitted sequence variably as a function of the position of each number in the total transmitted sequence, a "transfer" phase consists of the physical quantity being modulated by the total transmitted sequence, transferred and demodulated to form a total "received" sequence, a "decoding" phase consists of applying the said combinations to the numbers of the total received sequence and, where the results of the said combinations are not equal to the said predetermined modulo P values, deducing therefrom that a transmission error has occurred and correcting it, characterised in that a second one of the said combinations combines the numbers in the total transmitted sequence independently of their position in the total transmitted sequence, and characterised in that the second one of the combinations is the sum, modulo P, of the numbers of the total transmitted sequence.

8. Method for detecting and correcting any transmission error in an "initial" sequence of at most P-3 numbers, where P is a predetermined natural number, representing binary data modulating a predetermined physical quantity, characterised in that, successively:

an "encoding" phase consists of adding to the initial sequence two "coherence" numbers to form a "total transmitted" sequence, the two coherence numbers being determined so that two predetermined "coherence check" combinations applied to a total transmitted sequence each give a predetermined modulo P value, at least a first one of the said combinations combining the numbers in the total transmitted sequence variably as a function of the position of each number in the total transmitted sequence, a "transfer" phase consists of the physical quantity being modulated by the total transmitted sequence, transferred and demodulated to form a total "received" sequence, a "decoding" phase consists of applying the said combinations to the numbers of the total received sequence and, where the results of the said combinations are not equal to the said predetermined modulo P values, deducing therefrom that a transmission error has occurred and correcting it, characterised in that the first combination is the sum of the products of each of the numbers in the total transmitted sequence and a non-zero integer less than P called the "position number", the said position number being attributed only to the said position of the said number in the total transmitted sequence.

9. Method according to claim 8, characterised in that the said position number is a power of Q, Q being a primitive number of P, having as its exponent a number representing the position of the said number in the total transmitted sequence.

10. Method according to claim 8, characterised in that the "decoding phase" consists of adding all the numbers in the total received sequence, the difference between the said sum and the predetermined value corresponding to the second combination being equal to any transmission error and, if this error is not nil, dividing by the said error, modulo P, the difference between the sum of the products of each of the numbers in the total received sequence and the position number attributed to the said position of the said number in the total received sequence and the predetermined value corresponding to the second combination, and thereby obtaining the position number attributed to the position of the error in the total received sequence.

11. Method according to claim 10, characterised in that, each of the predetermined values being nil, the result of the second combination applied to the total received sequence is equal to any error and, if the said error is not nil, the result of the first combination applied to the total received sequence by the error is equal to the position number of the erroneous number in the total received sequence.

12. Method for detecting and correcting any error in the transfer of a "total transmitted" sequence of numbers each represented by a number N of binary symbols modulating a predetermined physical quantity, the said total transmitted sequence including at least two "coherence" numbers adapted, according to a "location and evaluation" process, to allow the rectification of any error, characterised in that:

in a "counting" phase, it consists of counting the number of binary symbols in the total received sequence originating from the demodulation of the physical quantity representing the total transmitted sequence, and where this number is equal to a multiple of N, minus 1, in a "replacement" phase, of replacing, in the total received sequence and successively, groups of N−1 consecutive binary symbols with groups of N "replacement" binary symbols, and, in a "validation" phase, of determining whether the position of this replacement is correct by using the location and evaluation process.

13. Method for detecting and correcting any error in the transfer of a "total transmitted" sequence of numbers each represented by a number N of binary symbols modulating a predetermined physical quantity, the said total transmitted sequence including at least two "coherence" numbers adapted, according to a "location and evaluation" process, to allow the rectification of any error, characterised in that:

in a "counting" phase, it consists of counting the number of binary symbols in the total received sequence originating from the demodulation of the physical quantity representing the total transmitted sequence, and, where this number is equal to a multiple of N, plus 1, in a "replacement" phase, of replacing, in the total received sequence and successively, groups of N+1 consecutive binary symbols with groups of N "replacement" binary symbols, and, in a "validation" phase, of determining whether the position of this replacement is correct by using the location and evaluation process.

14. Computer readable memory storing a computer program, characterized in that the program includes program steps to be executed to perform the method according to one of claims 1, 7, 8, 12 or 13.

15. Device for coding an "initial" sequence of at most P-3 numbers, where P is a predetermined natural number, including a central processing unit (11) adapted for adding, to the initial sequence, two "coherence" numbers in order to form a "total transmitted" sequence, the two coherence numbers being determined so that the result of each of two predetermined "coherence check" combinations applied to the total transmitted sequence, gives a predetermined modulo P value, at least a first one of the said combinations combining the numbers in the total transmitted sequence variably as a function of the position of each number in the total transmitted sequence and in that it includes a modulator of a physical quantity (17, 47) adapted for transmitting the total transmitted sequence whilst modulating a physical quantity, characterised in that P is a prime number.

16. Device according to claim 15, characterised in that P has a primitive number.

17. Device according to claim 16, characterized in that 2 is a primitive number of P.

18. Device for detecting and correcting an error in the transfer of a total transmitted sequence by a device according to claim 17, characterised in that it includes a demodulator (48) of the said physical quantity supplying a "received" total sequence representing the total transmitted sequence, and a central processing unit (41) adapted to apply the said combinations to the numbers of the total received sequence and, where the results of the said combinations are not equal to the said predetermined modulo P values, deducing therefrom that a transmission error has occurred.

19. Device according to claim 18, characterised in that the second combination is equal to the sum of the numbers in the total sequence, in that the processing unit is adapted to subtract from this second combination applied to the total received sequence the predetermined value equal to the sum of the numbers in the total transmitted sequence, any error to be corrected being equal to this difference, and in that the first combination is the sum of the products of the numbers in the total sequence transmitted and "position" numbers related to the positions of these numbers in the total sequence, the central unit being adapted, if the error is not nil, to divide the difference between the first combination applied to the total received sequence and the first combination applied to the total transmitted sequence, by any error, the result of this division giving the position number attributed to the position at which the erroneous number is found.

20. Device for detecting and correcting an error in the transfer of a total transmitted sequence of numbers each represented by N binary symbols, characterised in that it includes a demodulator (48) of a physical quantity supplying a "received" total sequence representing the total transmitted sequence, and a central processing unit (41) adapted to count the number of binary symbols in the total received sequence, and, where this number is equal to a multiple of N, minus 1, in a "replacement" phase, of replacing in the total received sequence and successively, groups of N-1 consecutive binary symbols with groups of N "replacement" binary symbols.

21. Device for detecting and correcting an error in the transfer of a total transmitted sequence of numbers each represented by N binary symbols, characterised in that it includes a demodulator (48) of a physical quantity supplying a "received" total sequence representing the total transmitted sequence, and a central processing unit (41) adapted to count the number of binary symbols in the total received sequence and, where this number is equal to a multiple of N, plus 1, in a "replacement" phase, of replacing in the total received sequence and successively, groups of N+1 consecutive binary symbols with groups of N "replacement" binary symbols.

22. Device according to one of claims 20 or 21, characterised in that the central processing unit (41) is adapted to effect a second combination equal to the sum of the numbers in the total sequence, to subtract from this combination applied to the total received sequence the predetermined value equal to the sum of the numbers in the total transmitted sequence, any error to be corrected being equal to this difference and, if the error is not nil, to effect a first combination equal to the sum of the products of the numbers in the total sequence transmitted and "position" numbers related to the positions of these numbers in the total sequence, dividing the difference between the first combination applied to the total transmitted sequence and the first combination applied to the total transmitted sequence, by any error, the result of this division giving the position number attributed to the position at which the erroneous number is found, and in that the replacement number is validated during the validation phase when the position number at which the erroneous number is found is that of the replacement number or when the error is nil.

23. Bar code printer (600), characterised in that it includes a device according to claim 17, the predetermined physical quantity modulated by the modulator (17, 47) being the bar reflectance.

24. Bar code reader (700), characterised in that it includes a device according to one of claims 19 to 21, the predetermined physical quantity demodulated by the demodulator (48) being the bar reflectance.

25. Network receiver (802), characterised in that it includes an error detection and correction device according to one of claims 19 to 21, the physical quantity demodulated by the demodulator (48) being conveyed by a cable network (801).

26. Remote receiver (902), characterised in that it includes an error detection and correction device according to one of claims 18 to 21, the physical quantity demodulated by the demodulator (48) being conveyed by the ambient environment.

* * * * *

UNITED STATES PATENT AND TRADEMARK OFFICE
CERTIFICATE OF CORRECTION

PATENT NO. : 5,905,739
DATED : May 18, 1999
INVENTOR(S) : PHILIPPE PIRET, ET AL.

It is certified that error appears in the above-identified patent and that said Letters Patent is hereby corrected as shown below:

COLUMN 18

Line 31, "either" should be deleted.

COLUMN 22

Line 43, "claims 19" should read --claims 18--; and
Line 48, "claims 19" should read --claims 18--.

Signed and Sealed this

Thirtieth Day of November, 1999

Attest:

Attesting Officer

Q. TODD DICKINSON

Acting Commissioner of Patents and Trademarks